United States Patent [19]

Takemoto et al.

[11] Patent Number: 4,850,103
[45] Date of Patent: Jul. 25, 1989

[54] METHOD FOR MANUFACTURING AN ELECTRONIC PART

[75] Inventors: Yoshiro Takemoto, Hirakata; Kenji Asano, Neyagawa, both of Japan

[73] Assignee: Matsushita Electric Industrial Co., Ltd., Japan

[21] Appl. No.: 181,426

[22] Filed: Apr. 14, 1988

[30] Foreign Application Priority Data

Apr. 15, 1987 [JP] Japan .................................. 62-92508

[51] Int. Cl.[4] ........................................... H01R 23/00
[52] U.S. Cl. ..................................... 29/827; 29/412; 29/759
[58] Field of Search ................. 29/740, 759, 827, 411, 29/412; 361/411

[56] References Cited

U.S. PATENT DOCUMENTS 3,916,515 11/1975 Walsh et al. ..................... 361/411 X
4,236,301 12/1980 Hug et al. ......................... 29/759 X
4,343,084 8/1982 Wilmerth .......................... 29/412 X
4,624,358 11/1986 Satou ............................... 29/827 X Primary Examiner—Timothy V. Eley
Assistant Examiner—Carl J. Arbes
Attorney, Agent, or Firm—Wenderoth, Lind & Ponack

[57] ABSTRACT

A method of manufacturing electronic parts which is constituted by the steps of moving a pair of elongated terminal wire carrying strips each carrying a row of terminal wires thereon in a longitudinal direction parallel to each other, mechanically securing a circuit board to the terminal wire carrying strips so as to transfer the board by the movement of the terminal wire carrying strips, mounting chip parts on the board and soldering them and simultaneously soldering the terminal wires on the strips onto the circuit board during the transfer, and cutting the terminal wire carrying strips off the board.

2 Claims, 3 Drawing Sheets

Fig. 3(a) (Prior Art)
Fig. 3(b) (Prior Art)
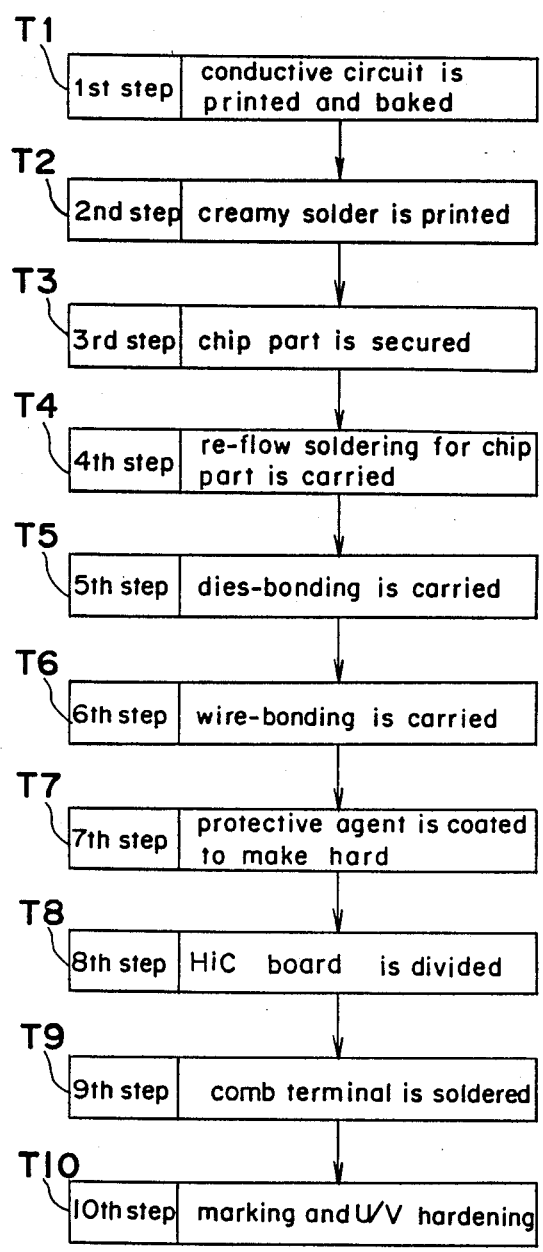
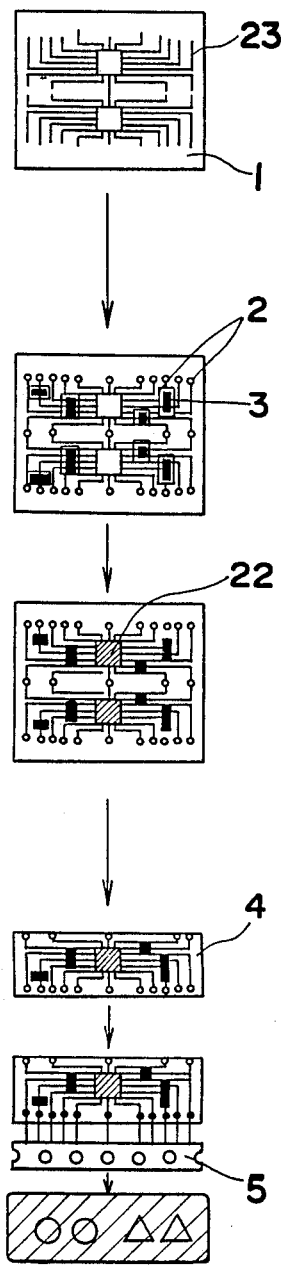

METHOD FOR MANUFACTURING AN ELECTRONIC PART

BACKGROUND OF THE INVENTION

1. Field of the Invention

The present invention generally relates to a method for manufacturing an electronic part such as a hybrid integrated circuit, etc.

2. Description of the Prior Art

A recent increased need for utilization of electronic parts has consequently given much importance to the method for manufacturing electronic parts.

One example of a conventional method for manufacturing electronic parts will be described with reference to the flow chart of FIG. 3a. The flow chart of FIG. 3a shows the sequence of operations in the conventional manufacturing method of electronic parts. A hybrid integrated circuit board 1 of FIG. 3b (hereinafter referred to as an HiC board) which is a ceramic board in the present example, is finished by printing and baking. A creamy solder 2 is deposited onto the HiC board 1 for securing chip parts 3 and a terminal wire carrying strip 5 wherein a plurality of terminals are mounted in parallel on a strip member to form a succession of terminal wires like the teeth of a comb along the length of the strip member. The HiC board 1 is divided into parts 4. The terminal wire carrying strip 5 having its own length and independent of each part 4 has the terminal wires connected to the HiC board 1 by the creamy solder 2.

The conventional manufacturing method referred to above includes 10 operations as follows.

In the first step T1, a circuit pattern is printed on the HiC board 1 by a paste-like conductor, and then the HiC board 1 and the conductor are heated to securely bake a conductive circuit 23 onto the HiC board 1.

In the second step T2, the creamy solder 2 is printed on the portions of the HiC board 1 where the chip parts 3 are to be mounted and the wires from the terminal wire carrying strip 5 are to be connected.

In the third step T3, the chip parts 3 are mounted onto the printed creamy solder 2.

In the fourth step T4, the HiC board 1, the creamy solder 2 and the mounted chip parts 3 are heated, and accordingly, the creamy solder 2 is melted, so that the chip parts 3 and the HiC board 1 are mechanically connected to each other, that is, reflow soldering is carried out.

In the fifth step T5, a semiconductive element 22 is fixed onto the HiC board 1 by a bonding agent (not shown), that is, die bonding is carried out.

In the sixth step T6, the semiconductive element 22 which has been securely bonded onto the HiC board 1 in the fifth step is mechanically connected to the conductive circuit 23 on the HiC board 1 by a fine wire (not shown) made of gold or aluminum, namely wire bonding is carried out.

In the seventh step T7, a protective agent is coated on the board for protecting the semiconductive element 22 and the fine wire connecting the semiconductive element 22 and the conductive circuit 23, and is then thermally hardened.

In the eight step T8, the HiC board 1 is divided into parts of a predetermined size.

In the ninth step T9, the terminal wires on the terminal wire carrying strip 5, which are provided for electrical connection with an external circuit, are subjected to reflow soldering by melting the creamy solder 2 in a reflow furnace.

Finally, in the tenth step T10, a number is marked on a predetermined position on the HiC board 1 by an ultraviolet hardening ink (not shown), and the ink is hardened through irradiation by ultraviolet rays (UV hardening), thereby to complete the electronic part.

In the above-described flow of operations, however, at least two reflow furnaces are required, one for securing the chip part onto the HiC board and one for connecting the terminal wires to the HiC board. Moreover, the abovedescribed prior art necessitates transfer and mounting devices to be provided respectively for the HiC board and for the terminal wire carrying strip. As a result, the manufacturing apparatus is inevitably bulky and expensive. Furthermore, the HiC board is subjected to many heating and cooling operations in the two reflow furnaces, resulting in distortion of the HiC board and consequently in such disadvantages that good product accuracy is difficult to achieve, and the yeld is reduced.

SUMMARY OF THE INVENTION

Accordingly, an essential object of the present invention is to provide an improved method for manufacturing electronic parts, with elimination of the above-described disadvantages inherent in the conventional manufacturing methods.

Another object of the present invention is to provide an improved method for manufacturing electronic parts of the type referred to above, in which an electronic chip part mounted on the board is mechanically connected to the wiring pattern on the board concurrently with the mechanical connecting of the comb terminal to the wiring pattern on the board, during the soldering process.

According to the manufacturing method of the present invention, a pair of elongated terminal wire carrying strips, rather than being independently provided, are placed parallel to each other and transferred in a longitudinal direction and the board of the substrate is mechanically fixed to the pair of the terminal wire carrying strips. Accordingly, the board is transferred while the terminal wire carrying strips are transferred. During the transfer of the board, the necessary operations for mounting chip parts onto the board and for soldering, etc. are performed. Thereafter, the wire terminals are cut off to obtain the desired electronic parts.

Accordingly, the terminal wires and the chip parts can be soldered to the printed circuit board at one time, resulting in reduction of the number of soldering machines needed, and at the same time reducing the possibility of thermal distortion of the printed circuit board. Furthermore, according to the present invention, the respective transfer means and mounting tools for the printed circuit board and for the terminal wire carrying strips can be commonly used.

BRIEF DESCRIPTION OF THE DRAWINGS

These and other objects and features of the present invention will become clear from the following description of the preferred embodiments thereof taken in conjunction with the accompanying drawings, in which:

FIGS. 3a and 3b are a flow chart showing the manufacturing process according to a conventional manufacturing method of electronic parts and representations of the electronic part at various steps of the flow chart.

DETAILED DESCRIPTION OF THE INVENTION

Figure 1:
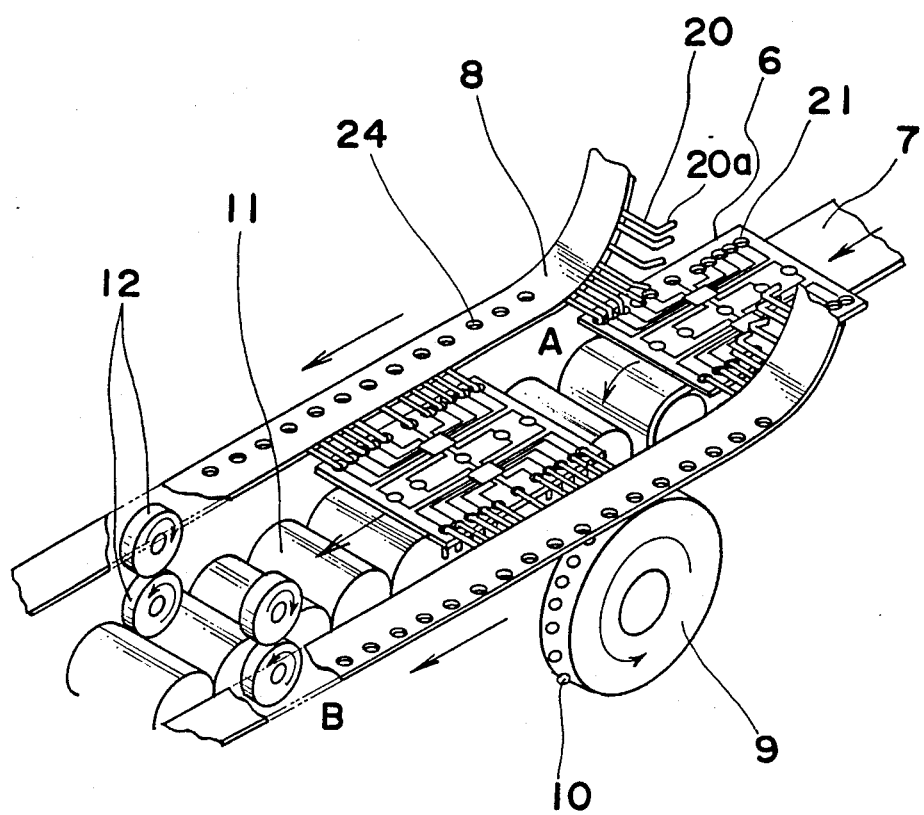
FIG. 1 is a perspective view of a part of an apparatus for carrying out the manufacturing method of electronic parts according to one preferred embodiment of the present invention.

Before the description of the present invention proceeds, it is to be noted that like parts are designated by like reference numerals throughout the accompanying drawings.

Referring to FIG. 1 for explaining one preferred embodiment of the present invention, a ceramic board constituted by a base plate 6 which has a conductive circuit printed and baked thereon to form a board of hybrid integrated circuit is arranged to be transferred by a belt conveyor 7 from a previous step. Terminal wires 20 each to be connected to a ceramic board 6 are serially mounted on an elongated terminal wire carrying strip 8, and a plurality of terminals are provided in parallel on the board to form a series of terminals like the teeth of a comb in the longitudinal direction of the board. Each terminal 20 has a bent portion 20a on the free end thereof which, when the strips 8 are caused to move parallel to the path of the boards 6 at position A, extend into connection apertures 21 in the board 6 at each termihnal on the board. A driving roller 9 for driving each terminal wire carrying strip 8 has pins 10 provided on the outer periphery thereof so as to drive the terminal wire carrying strip 8 through engagement of the pins 10 with transfer apertures 24 formed in the terminal wire carrying strip 8. There is further provided rollers 11 which support the ceramic board 6 from below and the ceramic board 6 is drawn by the terminal wire carrying strips 8 when the terminal strips 8 are driven by the driving roller 9 and the pins 10 after the terminal carrying strips 8 and the ceramic board 6 are mechanically connected at the position A, thereby to smoothly transfer the ceramic board 6. A pair of bending rollers 12 transfer, and at the same time, grasp the boards 6 from above and below where the ceramic board 6 and the terminal wires 20 are mechanically connected, by mutual rotation, so that the bent portions of the terminal wires 20 are bent further to be temporarily secured to the ceramic board 6.

Figure 2A:
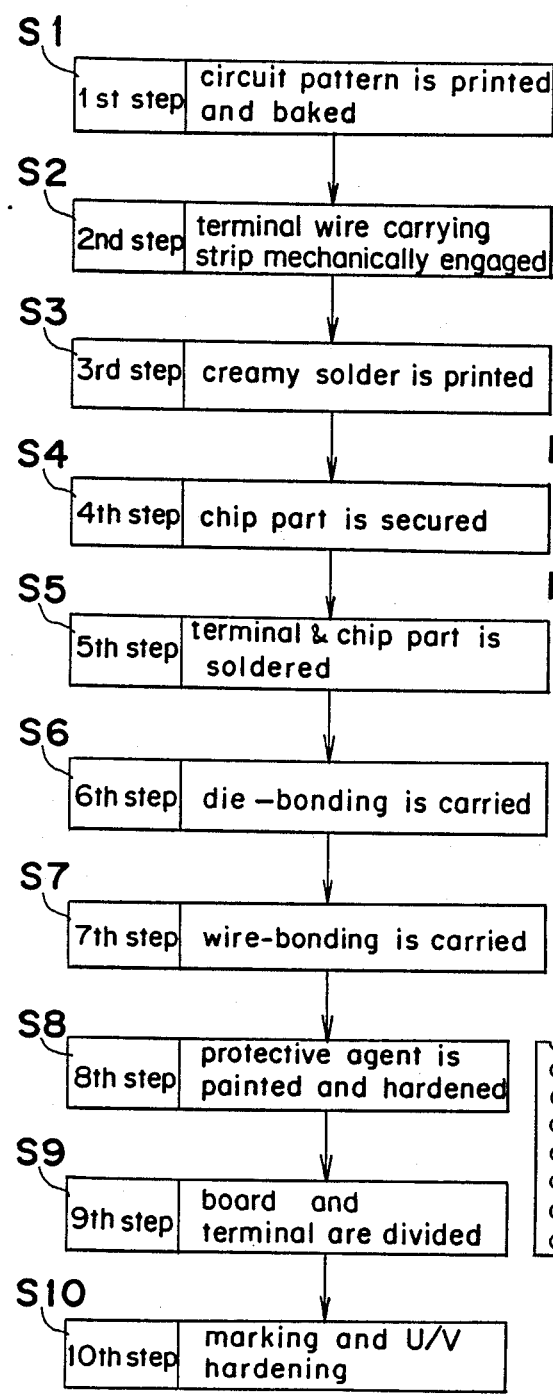
FIGS. 2a and 2b are a flow chart showing the manufacturing process in the manufacturing method of the present invention and representations of the electronic part at various steps of the flow chart.

Referring to the flow chart of FIG. 2a, each step in the manufacturing process according to the manufacturing method of the present invention will be described.

The manufacturing process is comprised of 10 steps. In the first step S1, a circuit pattern is printed by placing a pasty conductive material on the ceramic board 6, and the conductive circuit is baked onto the ceramic board 6 by heating the board and the conductive material. In the second step S2, a pair of elongated terminal wire carrying strips 8 are mechanically engaged with the ceramic board 6. In the third step S3, a creamy solder 13 is printed on predetermined terminals of the ceramic board 6 for securing a chip part 14 and the terminal wires 20 of the strips 8. In the fourth step, S4, the chip part 14 is mounted on the printed creamy solder 13. In the fifth step S5, the ceramic board 6 and the terminal wires 20 on the strip 8, and the ceramic board 6 and the chip part 14 are respectively mechanically connected to each other by reflow soldering by heating and melting the creamy solder 13 in the reflow furnace. In the sixth step S6, a semiconductive element 25 is fixedly bonded to the ceramic board 6 at a predetermined position by a bonding agent (not shown), namely, die bonding is carried out. In the seventh step S7, the semiconductive element 25 is electrically connected to the conductive circuit provided on the ceramic board 6 by a fine wire made of gold or aluminum, that is, wire bonding is performed. In the eighth step S8, a protective agent (not shown) is coated over the semiconductive element 25 with the ceramic board 6, and at the same time the protective agent is heat cured. In the ninth step S9, the ceramic board 6 and the terminal wires 20 of strip 8 are cut off into a given size. In the tenth step S10, the ceramic board 6 is marked with a number, etc. at a predetermined position thereof by an ultraviolet hardening ink which is in turn irradiated by ultraviolet rays to be hardened (UV hardened), thereby to complete the product.

Figure 2B:
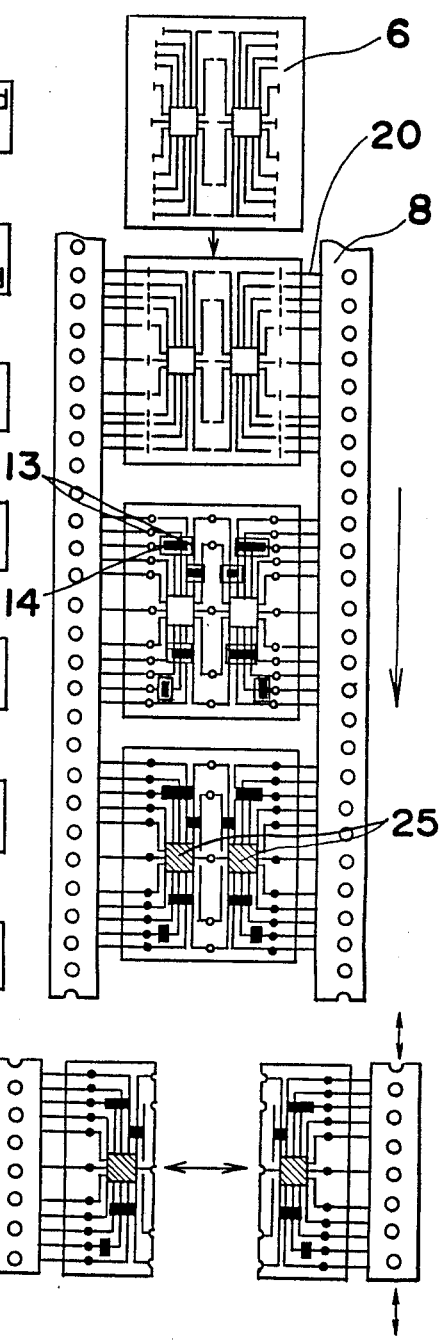

The manufacturing method of electronic parts comprised of the above-described steps of process will be described further with reference to FIGS. 1, 2a and 2b.

First, as shown in FIG. 1, the ceramic board 6 which has a conductive circuit printed and baked thereon in the previous step is transferred by the belt conveyor 7. At the position A of the transfer by the belt conveyor 7, bent portions 20a of the terminal wires 20 carried on the terminal wire carrying strips 8 are inserted into connection apertures 21 formed in the ceramic board 6. Accordingly, the ceramic board 6 having the bent portions 20a of the terminal wires 20 on strips 8 inserted into the connection apertures 21 is drawn by the terminal wire carrying strips 8 which are driven by the driving roller 9 through the pins 10, and accordingly moved by the rotation of the roller 11 to a next step. Then, at the position B, the bent portions 28 of the terminal wires 20 on strips 8 are bent when the bent portions pass between a pair of the caulking rollers 12, so that the terminal wire carrying strips are mechanically secured to the ceramic board 6. Thereafter also, the ceramic board 6 is still drawn by the terminal wire carrying strips 8 to be continuously transferred and processed together with the terminal wire carrying strips 8. As shown in FIG. 2a, the ceramic board 6, after finishing the first and second steps, is printed by the creamy solder 13 in the third step. In the fourth step, the chip part 14 is placed on the creamy solder 13. Then, in the fifth step, the chip part 14 is passed through the reflow furnace (not shown), so that the bent portions 20a and the chip part 14 are simultaneously soldered. A protective agent is coated and hardened in the eighth step in order to protect main functional parts which are die bonded and wire bonded in the sixth and seventh steps, respectively. Then, in the ninth step, the ceramic board 6 and the terminal wire carrying strips 8 are finally cut off unit by unit. Stamping is conducted in the tenth step to achieve a finished product.

As has been described above, according to the manufacturing method of the present invention, since the ceramic board and the terminal wire carrying strips are integrally connected and driven simultaneously by the driving of the roller, thereby to achieve continuous transfer and processing of the ceramic board and the terminal wires on the strips, the number of the driving means or mounting tools can be reduced. Furthermore, since it is arranged according to the present invention that the chip part and the terminal wires are soldered to the ceramic board simultaneously, they can pass through the reflow furnace a reduced number of times, resulting in decrease of possibilities of generation or distortion in the ceramic board.

It is to be noted here that although the HiC board is made of ceramic in the present embodiment, the material of the HiC board is not restricted to ceramic. Also, although the terminal wire carrying strips are mechanically secured to the HiC board through insertion of the bent portions of the terminal wire carrying strips into the connection apertures of the HiC board according to the present invention, the direction of the insertion is not restricted, and the terminal wire carrying strips may be mechanically secured to the HiC board through pressure welding.

As is clear from the foregoing description of the present invention, the terminal wire carrying strips having a plurality of terminals in parallel along the length thereof in the shape of a comb is connected to the ceramic board so as to achieve continuous transfer and continuous processing of the terminal wires and the ceramic board at the same time. Accordingly, it is not necessary to install transferring means and mounting tools separately for the terminal wires and the ceramic board. Moreover, the terminal wires and the chip part are soldered to the ceramic board simultaneously, and therefore only one reflow furnace is needed in the present invention, thereby achieving a compact and inexpensive manufacturing apparatus. Further, since the terminal wire carrying strips and the ceramic board pass through the reflow furnace fewer times, the ceramic board can be prevented from being deformed by heating and cooling operations, resulting in enhancement of the accuracy of the product and improvement of the yield.

Although the present invention has been fully described in connection with the preferred embodiments thereof with reference to the accompanying drawings, it is to be noted that various changes and modifications will be aopparent to those skilled in the art. Such changes and modifications are to be understood as included within the scope of the present invention as defined by the appended claims unless they depart therefrom.

What is claimed is:

1. A method for manufacturing electronic parts, which comprises the steps of:
    moving a pair of elongated terminal wire carrying strips, each carrying a row of terminal wires thereon, in a longitudinal direction parallel to each other;
    mechanically securing a circuit board to said elongated terminal wire carrying strips so as to transfer the board by the movement of said terminal wire carrying strips;
    mounting chip parts on the board and soldering the chip parts and the terminal wires on said strips onto the board during the transfer; and
    cutting the terminal wire carrying strips off the board.

2. A method for manufacturing electronic parts, which comprises the steps of:
    moving a pair of elongated terminal wire carrying strips, each carrying a row of terminal wires thereon, in a longitudinal direction parallel to each other;
    mechanically securing a circuit board to said elongated terminal wire carrying strips by inserting ends of the terminal wires on the terminal wire carrying strips into connection apertures in the circuit board so as to transfer the board by the movement of the terminal wire carrying strips;
    mounting chip parts on the board and soldering the chip parts onto the circuit board and simultaneously soldering the terminal wires on the strips into the connection apertures in the circuit board during the transfer; and
    cutting the terminal wires between the terminal wire carrying strips and the board to separate the board from the terminal wire carrying strips.

* * * * *